(12) United States Patent
Shiono

(10) Patent No.: US 7,970,254 B2
(45) Date of Patent: Jun. 28, 2011

(54) PLL CONTROL CIRCUIT OF OPTICAL DISC APPARATUS, AND RECORDING MEDIUM HAVING RECORDED THEREON PROGRAM FOR CONTROLLING THE OPTICAL DISC APPARATUS

(75) Inventor: Hiroyuki Shiono, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 1141 days.

(21) Appl. No.: 11/685,691

(22) Filed: Mar. 13, 2007

(65) Prior Publication Data

US 2007/0217760 A1 Sep. 20, 2007

(30) Foreign Application Priority Data

Mar. 14, 2006 (JP) .................... 2006-069798

(51) Int. Cl.
*H04N 5/932* (2006.01)
*H03L 7/08* (2006.01)
(52) U.S. Cl. ........ 386/204; 375/373; 375/374; 375/375; 375/376; 327/156; 327/157; 348/536
(58) Field of Classification Search .................. 327/156, 327/157; 331/11, 14, 20; 348/536; 386/200–204; 375/373–376; 332/144, 145
See application file for complete search history.

(56) References Cited

U.S. PATENT DOCUMENTS

| | | | | |
|---|---|---|---|---|
| 5,497,126 A | * | 3/1996 | Kosiec et al. | 331/1 A |
| 5,623,523 A | * | 4/1997 | Gehrke | 375/376 |
| 7,203,149 B1 | * | 4/2007 | Sano | 369/59.11 |

FOREIGN PATENT DOCUMENTS

| | | |
|---|---|---|
| JP | 10-112141 | 4/1998 |
| JP | 10-208244 | 8/1998 |

* cited by examiner

*Primary Examiner* — Thai Tran
*Assistant Examiner* — Mishawn Dunn
(74) *Attorney, Agent, or Firm* — SoCal IP Law Group LLP; Steven C. Sereboff; John E. Gunther

(57) ABSTRACT

A PLL control circuit of an optical disc apparatus comprising: a voltage frequency conversion circuit that adjusts an oscillating frequency based on a control voltage to generate a first frequency signal; a phase comparison circuit that compares the phase of the first frequency signal with the phase of a second frequency signal generated based on an RF (Radio Frequency) signal at the time of photoelectric conversion of reflected light of the laser beam applied to an optical disc, to generate a phase difference signal indicating a phase difference between the first frequency signal and the second frequency signal; a charge pump circuit that generates the control voltage for synchronizing the phases of the first frequency signal and the second frequency signal according to the phase difference signal; a first detection circuit that detects whether the RF signal exceeds a predetermined level; a second detection circuit that detects whether the phases of the first frequency signal and the second frequency signal are synchronized; and a control circuit that controls the charge pump circuit to generate the control voltage regardless of the phase difference signal, if the first detection circuit detects that the RF signal exceeds the predetermined level, and to generate the control voltage according to the phase difference signal, if the second detection circuit detects that the phases of the first frequency signal and the second frequency signal are synchronized.

5 Claims, 8 Drawing Sheets

PLL CONTROL CIRCUIT OF OPTICAL DISC APPARATUS, AND RECORDING MEDIUM HAVING RECORDED THEREON PROGRAM FOR CONTROLLING THE OPTICAL DISC APPARATUS

CROSS-REFERENCE TO RELATED APPLICATION

This application claims the benefit of priority to Japanese Patent Application No. 2006-69798, filed Mar. 14, 2006, of which full contents are incorporated herein by reference.

BACKGROUND OF THE INVENTION

1. Field of the Invention

The present invention relates to a PLL control circuit of an optical disc apparatus and a recording medium having recorded thereon a program for controlling the optical disc apparatus.

2. Description of the Related Art

Currently, optical disc apparatuses are used which reproduce information by rotating and applying laser beams to optical discs (e.g., CD (Compact Disc), DVD (Digital Versatile disc)). Some optical disc apparatuses have PLL (Phase Locked Loop) circuits to generate a clock (hereinafter, a reproduction clock) for the reproduction process and the rotation control of the optical discs. Describing with reference to FIG. 7, first, the optical disc apparatus performs photoelectric conversion of the reflected light of the laser beam applied to a recording surface of an optical disc to generate an RF (Radio Frequency) signal. The RF signal is binarized at a slice level defined by feedback control of an SLC (Slice Level Control) circuit 101 to generate a binarized signal, which is output to a PLL control circuit 100. The PLL control circuit 100 includes a phase comparison circuit 102, a 1/n division circuit 103, a charge pump circuit 104, an LPF (Low Pass Filter) 105, a VCO (Voltage Controlled Oscillator) circuit 106, etc., and uses feedback control consisting of operation of each circuit to generate the reproduction clock which synchronizes the phase of the frequency signal with the phase of the binarized signal. A decoder 107 at the subsequent stage performs a decode process for the binarized signal based on the reproduction clock to reproduce information in good condition. Hereinafter, locking of the PLL control circuit 100 indicates a state that the PLL control circuit 100 synchronizes the phase of the frequency signal with the phase of the binarized signal to generate the reproduction clock.

By the way, so-called defects such as scratches and dusts may be formed due to impacts or rough handling on the recording surface of the optical disc and the incidence surface where the laser beam is applied. When the laser beam is applied to the defects, the RF signal has a waveform with varied amplitude due to the variation of the light amount of the laser beam or the reflected light, as shown by the RF signal (period T12) of FIG. 8, for example. Since the amplitude of the RF signal is varied, the slice level of the SLC circuit 101 becomes unsteady and, as a result, the binarized signal becomes an unsteady signal, which is input to the PLL control circuit 100. Therefore, the phases of the binarized signal and the frequency signal may become asynchronous, and the locking of the PLL control circuit 100 may be released (hereinafter, unlocking of the PLL control circuit 100). This RF signal may affect signals (such as a focus error signal and a tracking error signal) generated by the optical disc apparatus for various servo controls (focus control and tracking control) and may generate malfunctions of the optical disc apparatus.

Therefore, the optical disc apparatus may include a defect detection circuit 108 for detecting the RF signal affected by defects. The PLL control circuit 100 may include a lock determination circuit 109, a CP (Charge Pump) boost control circuit 110, and a timer 111 to relock the PLL control circuit 100 regardless of the phase comparison of the phase comparison circuit 102 when the laser beam is no longer applied to the defect due to the rotation of the optical disc and the binarized signal processable for reproduction is input again.

With reference to FIG. 8, description will be made of the detection of the RF signal affected by defects and the relocking of the PLL control circuit 100. The RF signal until t10 and after the period T12 shows an example of the RF signal that is not affected by defects.

The defect circuit 108 detects the RF signal affected by defects, for example, by determining whether a difference between the peak level and the bottom level of the RF signal becomes less than a predetermined level. When it is determined that the difference between the peak level and the bottom level of the RF signal becomes less than a predetermined level, the defect detection circuit 108 outputs a high-level defect signal (t11). For example, the optical disc apparatus suspends various servo controls based on the rising edge of the defect signal. As a result, the malfunctions, etc., due to the defects can be avoided. The optical disc apparatus resumes various servo controls based on the falling edge of the defect signal.

On the other hand, the lock determination circuit 109 compares the phase of the binarized signal with the phase the frequency signal to determine the locking or unlocking of the PLL control circuit 100. When it is determined that the PLL control circuit 100 is unlocked (t12), the lock determination circuit 109 outputs a signal indicating the determination result to the CP boost control circuit 110. The CP boost control circuit 110 allows the timer 111 to start clocking based on the signal from the lock determination circuit 109 to determine whether a predetermined period T11 has elapsed. If it is determined that the clocking of the timer 111 attains the period T11, the CP boost control circuit 110 transmits to the charge pump circuit 104 a high-level signal (hereinafter, a CP control signal) for synchronizing the phases of the binarized signal and the frequency signal regardless of the phase comparison of the phase comparison circuit 102 (t13). The charge pump circuit 104 performs so-called boost operations that increases a voltage output to the LPF 105 based on the CP control signal. The LPF 105 outputs to the VCO circuit 106 a control voltage (hereinafter, a VCO control voltage) acquired by smoothing the output voltage from the charge pump circuit 104. As shown in FIG. 8, the VCO control voltage is repeatedly increased in accordance with the above boost of the charge pump circuit 104 to synchronize the phases of the binarized signal and the frequency signal. The VCO circuit 106 generates a frequency signal corresponding to the level of the VCO control voltage and outputs the signal to the 1/n division circuit 103. The 1/n division circuit 103 outputs to the phase comparison circuit 102 and the lock determination circuit 109 a frequency signal acquired by dividing the frequency signal from the VCO circuit 106 into 1/n. When the binarized signal processable for reproduction is input again, to quickly synchronize the phases of the binarized signal and the frequency signal (to relock the PLL control circuit 100), the charge pump circuit 104 is preliminarily boosted to increase the output voltage of the charge pump circuit 104 after the predetermined period T11 has elapsed.

When the laser beam is no longer applied to the defect due to the rotation of the optical disc, the RF signal processable for reproduction is input to the SLC circuit 101 again. This RF signal is binarized to generate a binarized signal, which input to the phase comparison circuit 102. The phases of the binarized signal and the frequency signal are quickly synchronized by the feedback control of the PLL control circuit 100 and the above boost of the charge pump circuit 104 (t14). As a result, the information can be reproduced from the optical disc without impairing the binarized signal. If it is determined that the PLL control circuit 100 is relocked from the phase comparison of the binarized signal and the frequency signal, the lock determination circuit 109 transmits to the CP boost control circuit 110 a signal for stopping the output of the CP control signal from the CP boost control circuit 110 (t15).

Such a conventional optical disc apparatus is disclosed in Japanese Patent Application Laid-Open Publication Nos. 10-208244 and 10-112141, for example.

However, in the conventional PLL control circuit 100, the start of the boost of the charge pump circuit 104 is controlled by time management based on the unlocking of the PLL control circuit 100 and, therefore, variations may be generated in the boost period of the charge pump circuit 104.

Specifically, for example, if the period T12 becomes long relative to the period T11, the period T11 may become relatively short which is a period until the boost of the charge pump circuit 104 and the boosting period of the charge pump circuit 104 may become long. Therefore, power consumption may be increased because the boost period of the charge pump circuit 104 becomes long. Since the boost is performed while the slice level of the SLC 101 is not determined, the VCO control voltage becomes more unsteady, resulting in delay in the phase synchronization. Alternatively, if the period T12 is short relative to the period T11, the boost period of the charge pump circuit 104 may become short in the period T12. Therefore, although the binarized signal processable for reproduction is input to the PLL control circuit 100, the synchronization of the phases of the binarized signal and the frequency signal may be delayed and the optical disc apparatus may not quickly perform the information reproduction process. As a result, performance may be deteriorated in the information reproduction process in the optical disc apparatus.

SUMMARY OF THE INVENTION

In order to solve the above problems, an aspect of the present invention provides a PLL control circuit of an optical disc apparatus comprising: a voltage frequency conversion circuit that adjusts an oscillating frequency based on a control voltage to generate a first frequency signal; a phase comparison circuit that compares the phase of the first frequency signal with the phase of a second frequency signal generated based on an RF (Radio Frequency) signal at the time of photoelectric conversion of reflected light of the laser beam applied to an optical disc, to generate a phase difference signal indicating a phase difference between the first frequency signal and the second frequency signal; a charge pump circuit that generates the control voltage for synchronizing the phases of the first frequency signal and the second frequency signal according to the phase difference signal; a first detection circuit that detects whether the RF signal exceeds a predetermined level; a second detection circuit that detects whether the phases of the first frequency signal and the second frequency signal are synchronized; and a control circuit that controls the charge pump circuit to generate the control voltage regardless of the phase difference signal, if the first detection circuit detects that the RF signal exceeds the predetermined level, and to generate the control voltage according to the phase difference signal, if the second detection circuit detects that the phases of the first frequency signal and the second frequency signal are synchronized.

To solve the above problems, another aspect of the present invention provides a recording medium having a program recorded thereon, the program operable to drive a computer controlling an optical disc apparatus that comprises: a PLL circuit including a voltage frequency conversion circuit that adjusts an oscillating frequency based on a control voltage to generate a first frequency signal, a phase comparison circuit that compares the phase of the first frequency signal with the phase of a second frequency signal generated based on an RF signal at the time of photoelectric conversion of reflected light of the laser beam applied to an optical disc, to generate a phase difference signal indicating a phase difference between the first frequency signal and the second frequency signal, and a charge pump circuit that generates the control voltage for synchronizing the phases of the first frequency signal and the second frequency signal according to the phase difference signal; a first detection circuit that detects whether the RF signal exceeds a predetermined level; and a second detection circuit that detects whether the phases of the first frequency signal and the second frequency signal are synchronized; to implement a function of controlling the charge pump circuit to generate the control voltage regardless of the phase difference signal, if the first detection circuit detects that the RF signal exceeds the predetermined level, and to generate the control voltage according to the phase difference signal, if the second detection circuit detects that the phases of the first frequency signal and the second frequency signal are synchronized.

According to the present invention, regardless of the phase comparison of the binarized signal and the frequency signal, the output voltage of the charge pump circuit can be increased based on a state in which the RF signal exceeds a predetermined level. The features of the present invention will become apparent from the accompanying drawings and the description in the specification.

BRIEF DESCRIPTION OF THE DRAWINGS

To understand the present invention and the advantages thereof more thoroughly, the following description should be read in conjunction with the accompanying drawings, in which.

DETAILED DESCRIPTION OF THE INVENTION

From the contents of the description and the accompanying drawings, at least the following details will become apparent.

==Overall Configuration of Optical Disc Apparatus==

Figure 1:
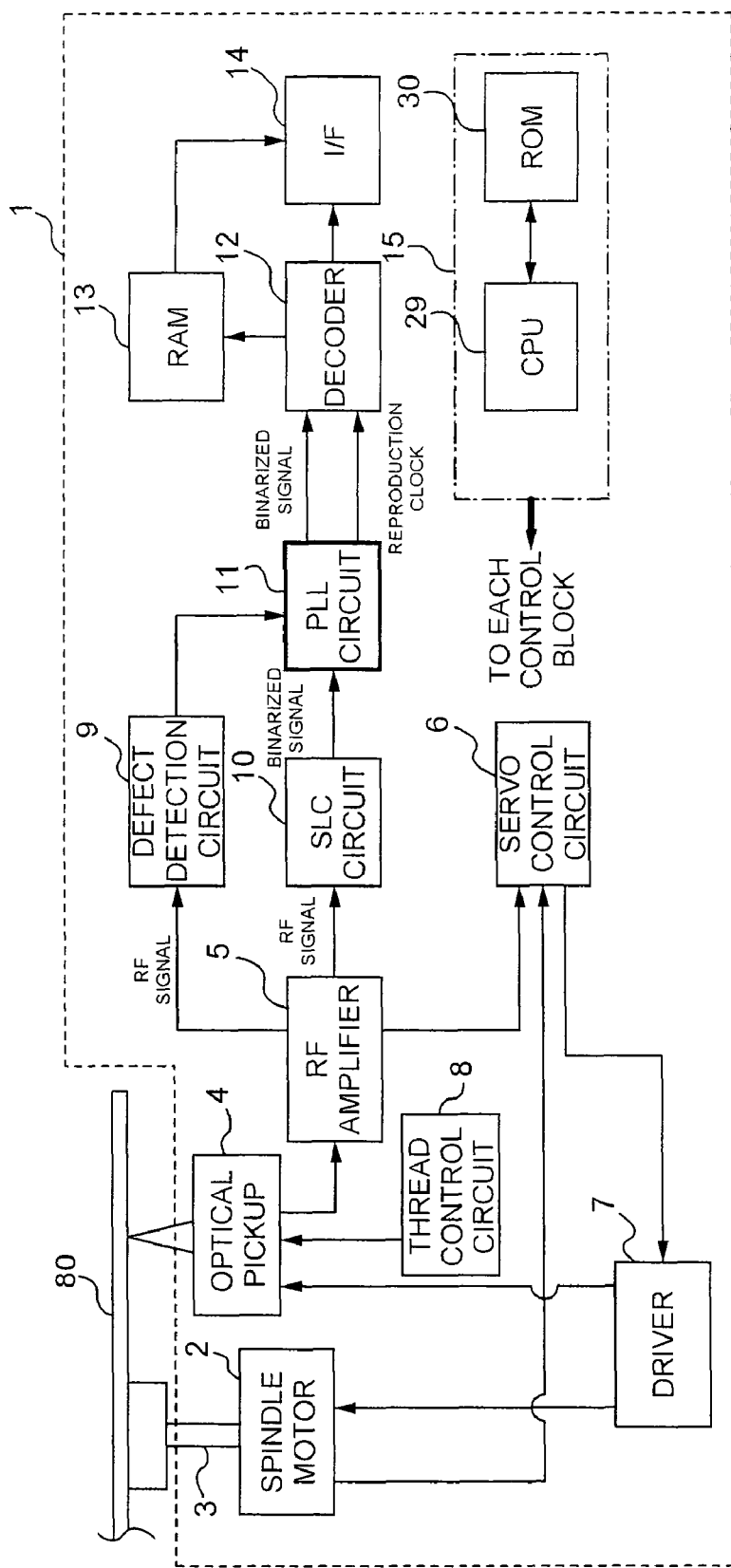
FIG. 1 is a functional block diagram of an overall configuration of an optical disc apparatus.
Figure 2:
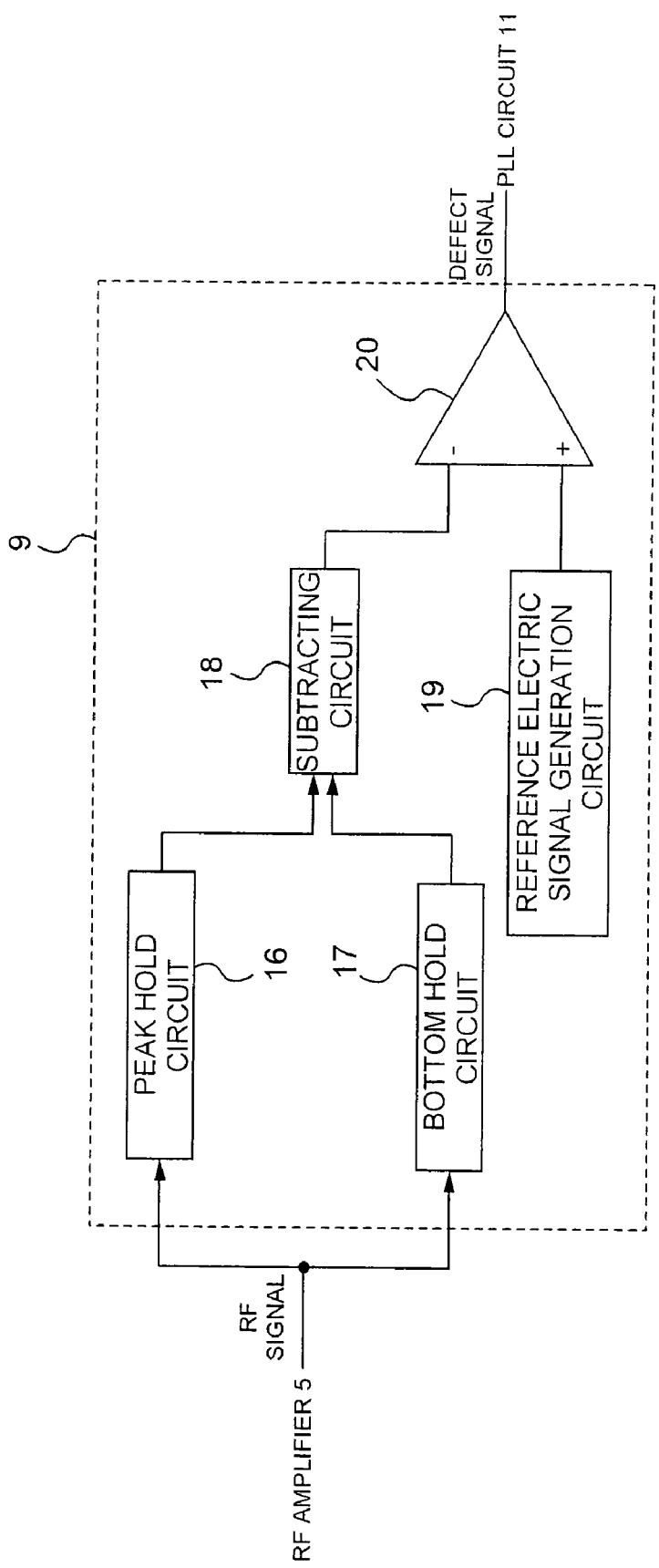
FIG. 2 is a functional block diagram of an example of a configuration of a defect detection circuit.
Figure 8:
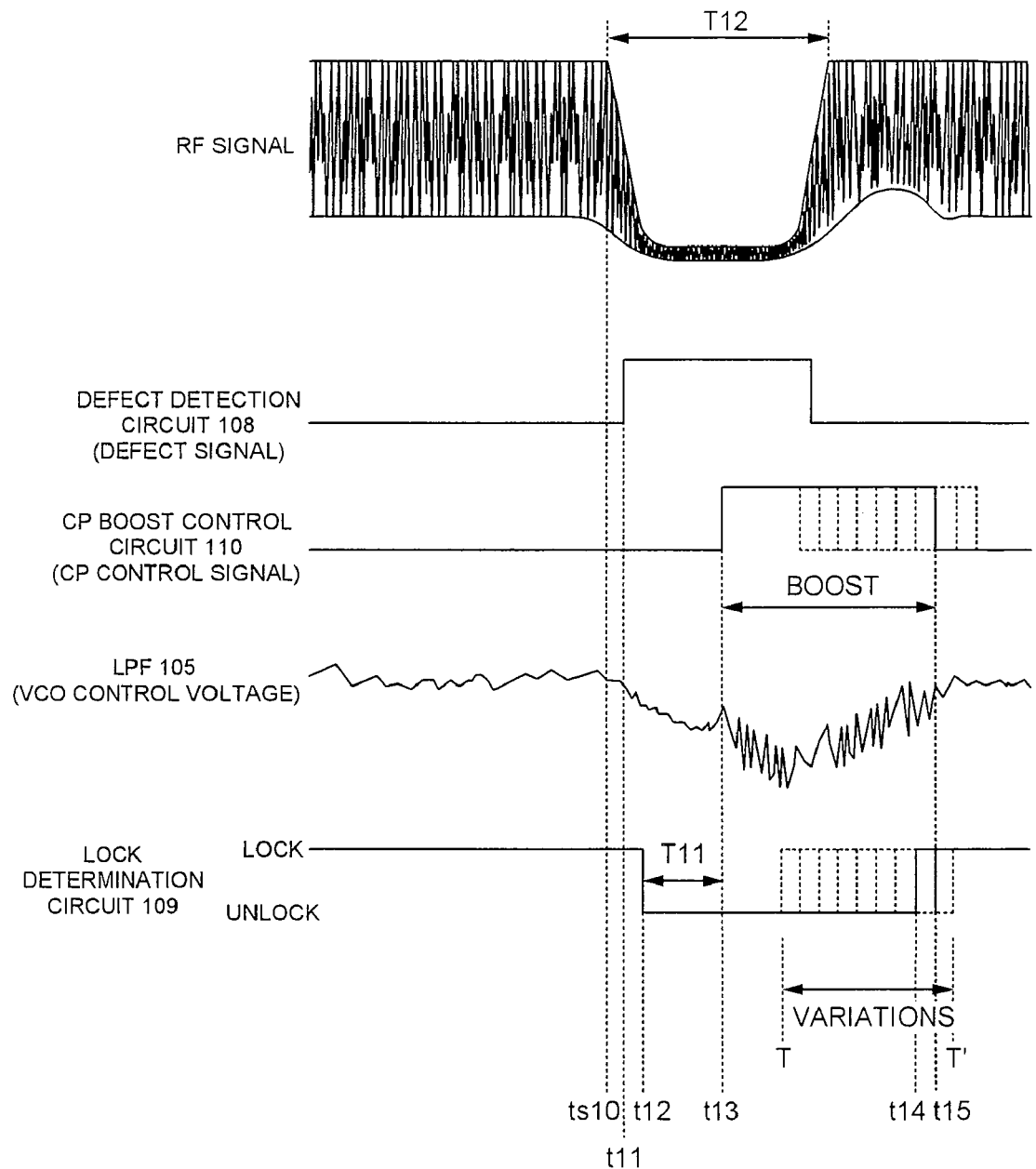
FIG. 8 is a timing chart of an RF signal and the operation of the conventional PLL control circuit.

An overall configuration of an optical disc apparatus 1 including a PLL control circuit 11 according to the present invention will be described with reference to FIGS. 1 and 2 and to FIG. 8 as needed. FIG. 1 is a functional block diagram of the overall configuration of the optical disc apparatus 1 according to the present invention. FIG. 2 is a functional block diagram of an example of a configuration of a defect detection circuit 9 (first detection circuit) shown in FIG. 1. In the description of this embodiment, an optical disc 80 for information reproduction is the disc of the CD standard, for example.

The optical disc apparatus 1 includes a spindle motor 2, a rotation shaft 3, an optical pickup 4, an RF amplifier 5, a servo control circuit 6, a driver 7, a thread control circuit 8, a defect detection circuit 9, an SLC circuit 10, a PLL control circuit 11, a decoder 12, a RAM (Random Access Memory) 13, an interface (I/F) 14, and a general control circuit 15.

The spindle motor 2 is rotated by applying a control voltage from the driver 7 to a spindle motor coil (not shown) and rotates, for example, an optical disc 80 disposed on a chucking mechanism fixed to the rotation shaft 3 in a predetermined direction.

The optical pickup 4 includes a semiconductor laser, a photodetector, an actuator, various optical systems (collimator lens, anamorphic lens, etc.), and an objective lens, which are not shown. The semiconductor laser emits a laser beam with a wavelength (780 nm to 790 nm) corresponding to the standard of the optical disc 80. The laser beam is transmitted through and reflected by various optical systems and is emitted from the objective lens to the optical disc 80. The laser beam is applied to the recording surface (not shown) of the optical disc 80, reflected by the reflection surface (not shown), and made incident on the objective lens of the optical pickup 4. The reflected light of the laser beam made incident on the optical pickup 4 is transmitted through and reflected by various optical systems and is received by the photodetector. The photodetector generates a photoelectric conversion signal corresponding to the light amount of the reflected light of the laser beam and outputs the signal to the RF amplifier 5.

The RF amplifier 5 amplifies the photoelectric conversion signal from the optical pickup 4 with a predetermined gain to generate an RF signal, which is output to the defect detection circuit 9 and the SLC circuit 10. Based on the photoelectric conversion signal, the RF amplifier 5 generates signals for various servo controls such as a focus error signal for moving the objective lens in the focus direction (light axis direction), a tracking error signal for moving the objective lens in the tracking direction (radial direction of the optical disc 80), etc. via the actuator of the optical pickup 4 and outputs the signals to the servo control circuit 6.

The servo control circuit 6 generates a focus control signal, a tracking control signal, etc., based on the signals for various servo controls from the RF amplifier 5 and outputs the signals to the driver 7. The servo control circuit 6 generates an FG (Frequency Generator) signal at a frequency corresponding to the rotation rate of the spindle motor 2 based on a back electromotive voltage when the spindle motor 2 rotates. The servo control circuit 6 outputs a rotation control signal to the driver 7 based on the FG signal to rotate the spindle motor 2 at the rotation rate indicated by the general control circuit 15.

The driver 7 applies the control voltage to the actuator of the optical pickup 4 based on the focus control signal, tracking control signal, etc., from the servo control circuit 6. As a result, the objective lens can be moved in the focus direction to focus the laser beam onto the recording surface while the objective lens can be moved in the tracking direction to allow the laser beam to follow the track formed on the recording surface. The driver 7 applies the control voltage to the spindle motor coil of the spindle motor 2 based on the rotation control signal from the servo control circuit 6. As a result, the spindle motor 2 is rotated at the rotation rate indicated by the general control circuit 15.

The thread control circuit 8 rotates the stepping motor not shown to move the optical pickup 4 in the tracking direction based on the instruction signal from the general control circuit 15.

As shown in FIG. 2, the defect detection circuit 9 includes a peak hold circuit 16 (a holding circuit), a bottom hold circuit 17 (a holding circuit), a subtracting circuit 18, a reference electric signal generation circuit 19, and a comparison circuit 20 (a level detection circuit). The peak hold circuit 16 holds the peak level of a predetermined period of the RF signal from the RF amplifier 5. The bottom hold circuit 17 holds the bottom level of the RF signal with regard to the same predetermined period as the peak hold circuit 16. The subtracting circuit 18 outputs to the comparison circuit 20 an electric signal indicating a subtraction result acquired by subtracting the bottom level held by the bottom hold circuit 17 from the peak level held by the peak hold circuit 16. The reference electric signal generation circuit 19 outputs to the comparison circuit 20 a reference electric signal (predetermined level) for determining in the comparison circuit 20 whether the RF signal input from the RF amplifier 5 is the RF signal acquired when the laser beam is applied to a defect of the optical disc 80. The reference electric signal will hereinafter be described with reference to FIG. 8. When the laser beam is applied to a defect of the optical disc 80, the amplitude of the RF signal (during T12) is smaller than the amplitude of the RF signal acquired when the laser beam is not applied to a defect of the optical disc 80. That is, when the laser beam is applied to a defect, the difference between the peak level and the bottom level of the RF signal is smaller than the difference between the peak level and the bottom level of the RF signal acquired when the laser beam is not applied to a defect. Therefore, for example, by setting the reference electric signal generation circuit 19 such that the reference electric signal is defined as the smallest electric signal output by the subtracting circuit 18 when the laser beam is not applied to a defect, it can be determined in the comparison circuit 20 whether the signal is the RF signal acquired when the laser beam is applied to a defect. The reference electric signal can preliminarily be set through experiment, etc., by detecting the output of the subtracting circuit 18 when the laser beam is not applied to a defect. When the level of the electric signal from the subtracting circuit 18 is equal to or higher than the level of the reference electric signal from the reference electric signal generation circuit 19, the comparison circuit 20 outputs a low-level defect signal to the PLL control circuit 11. That is, when the laser beam is not applied to a defect of the optical disc 80, the defect detection circuit 9 outputs the low-level defect signal to the PLL control circuit 11. When the level of the electric signal is less than the level of the reference electric signal, the comparison circuit 20 outputs a high-level defect signal to the PLL control circuit 11. That is, when the laser beam is applied to a defect of the optical disc 80, the defect detection circuit 9 outputs the high-level defect signal to the PLL control circuit 11.

Describing with reference to FIG. 1 again, the SLC circuit 10 includes a comparison circuit and an integration circuit not shown, and the feedback control of the slice level is performed by inputting the output of the comparison circuit through the integration circuit to one input terminal of the comparison circuit. The SLC circuit 10 outputs to the PLL control circuit 11 a binarized signal (a second frequency signal) acquired by performing binarization at the slice level for the RF signal input to the other input terminal of the comparison circuit from the RF amplifier 5.

The decoder 12 extracts digital data by detecting the level of the binarized signal, for example, at the timing of the rising edge of the reproduction clock. The decoder 12 performs decode processes such as the EFM (Eight Fourteen Modulation) demodulation corresponding to the standard of the optical disc 80 and the error correction of the CIRC (Cross Interleaved Reed-Solomon Code), etc., for the digital data. As a result, information is reproduced from the recording surface of the optical disc 80. The reproduction data are results of the decode process of the decoder 12 and are output to the RAM 13 or the interface 14 based on the instruction of the general control circuit 15.

The interface 14 is provided for transmission and reception of the reproduction data between, for example, a host computer (not shown) and the optical disc apparatus 1 connected through a connection terminal (not shown). The interface 14 includes the ATAPI (AT Attachment Packet Interface) standard, the SCSI (Small Computer System Interface), the IEEE (Institute of Electrical and Electronic Engineers) 1394 standard, the USB (Universal Serial Bus) standard, etc.

The RAM 13 retains the reproduction data from the decoder 12. The reproduction data retained in the RAM 13 are read based on the instruction from the general control circuit 15 and are output to the host computer through the interface 14. The RAM 13 is configured by volatile memory element such as SRAM (static RAM) and the reproduction data retained in the RAM 13 is retained with a backup power source.

The general control circuit 15 includes a CPU (Central Processing Unit) 29, and a ROM (Read Only Memory) 30. The ROM 30 stores program data for controlling the above control blocks in advance. The CPU 29 includes an address counter (not shown) that specifies addresses of the ROM 30, a program logic array (not shown) that decrypts the program data read from the ROM 30, a calculation logic unit (not shown) that performs logical operation, a register (not shown) that temporarily stores the calculation data, etc. The CPU 29 analyzes the program data read from the ROM 30 and controls each control block to allow the optical disc apparatus 1 to perform processing operation for information reproduction from the optical disc 80. The general control circuit 15 suspends the above various servo controls, etc., of the optical disc apparatus 1 based on the rising edge of the defect signal from the defect detection circuit 9. The general control circuit 15 resumes the various servo controls, etc., of the optical disc apparatus 1 based on the falling edge of the defect signal.

==Details of PLL Control Circuit 11==

Figure 3:
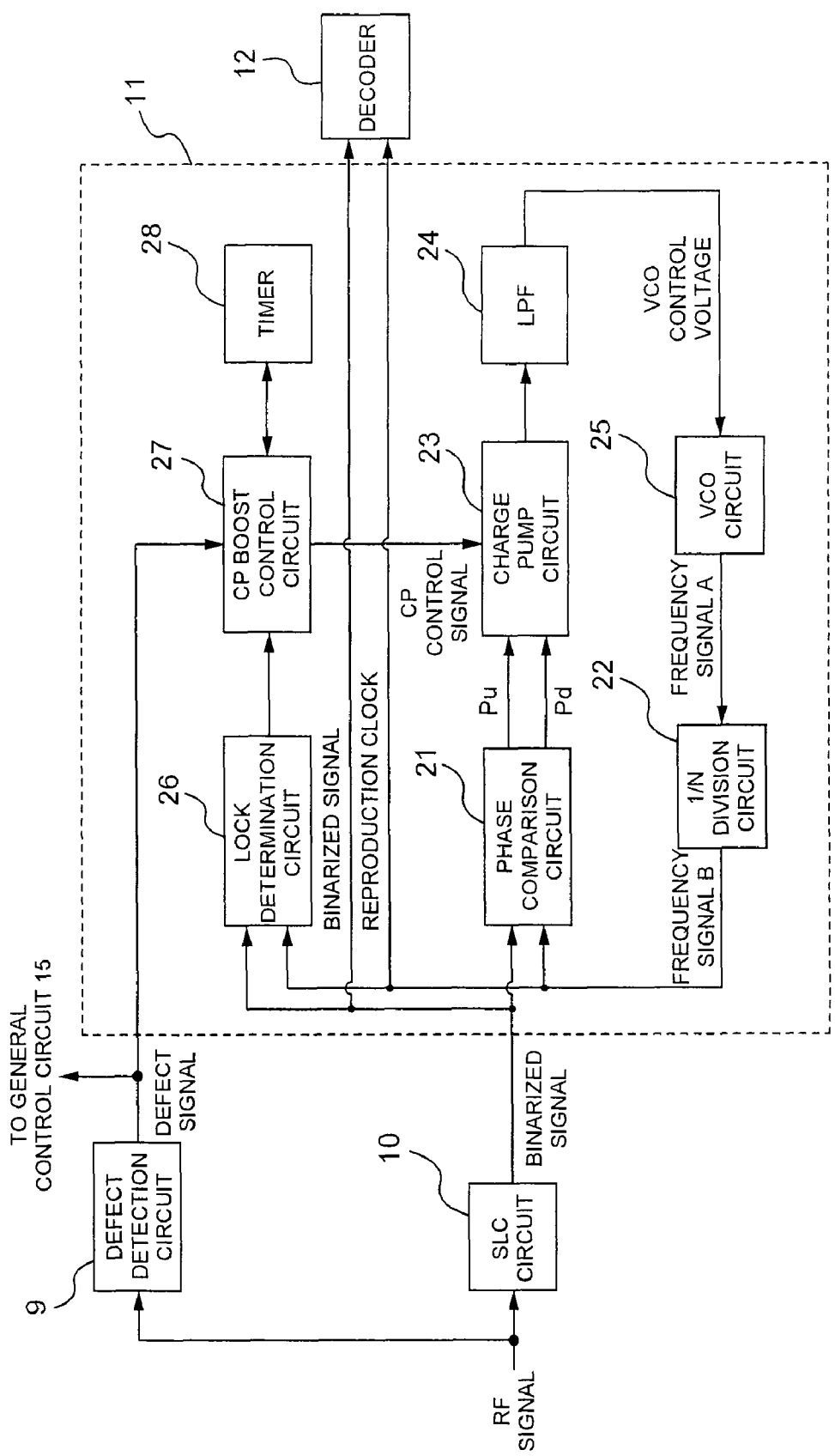
FIG. 3 is a functional block diagram of an example of a configuration of a PLL control circuit according to the present invention.
Figure 4:
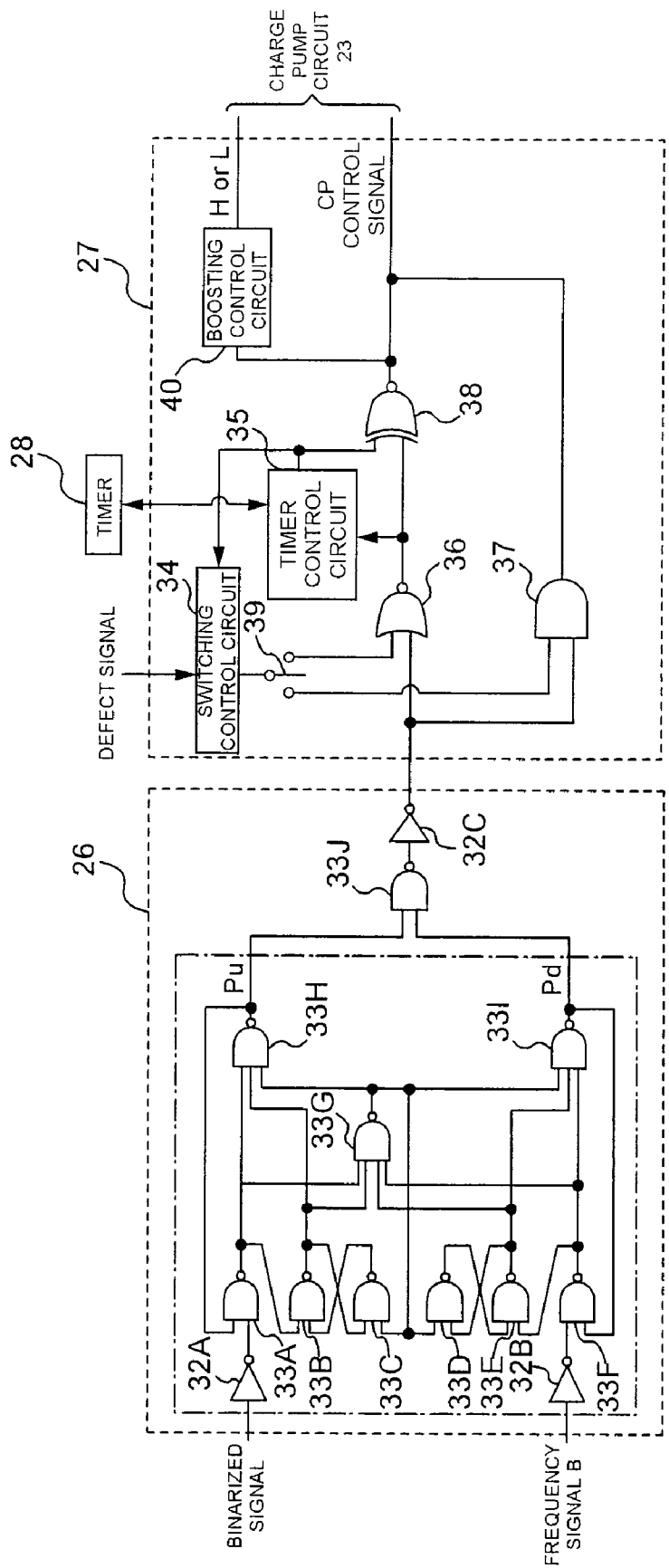
FIG. 4 depicts an example of configurations of a lock determination circuit and a CP boost control circuit.
Figure 5:
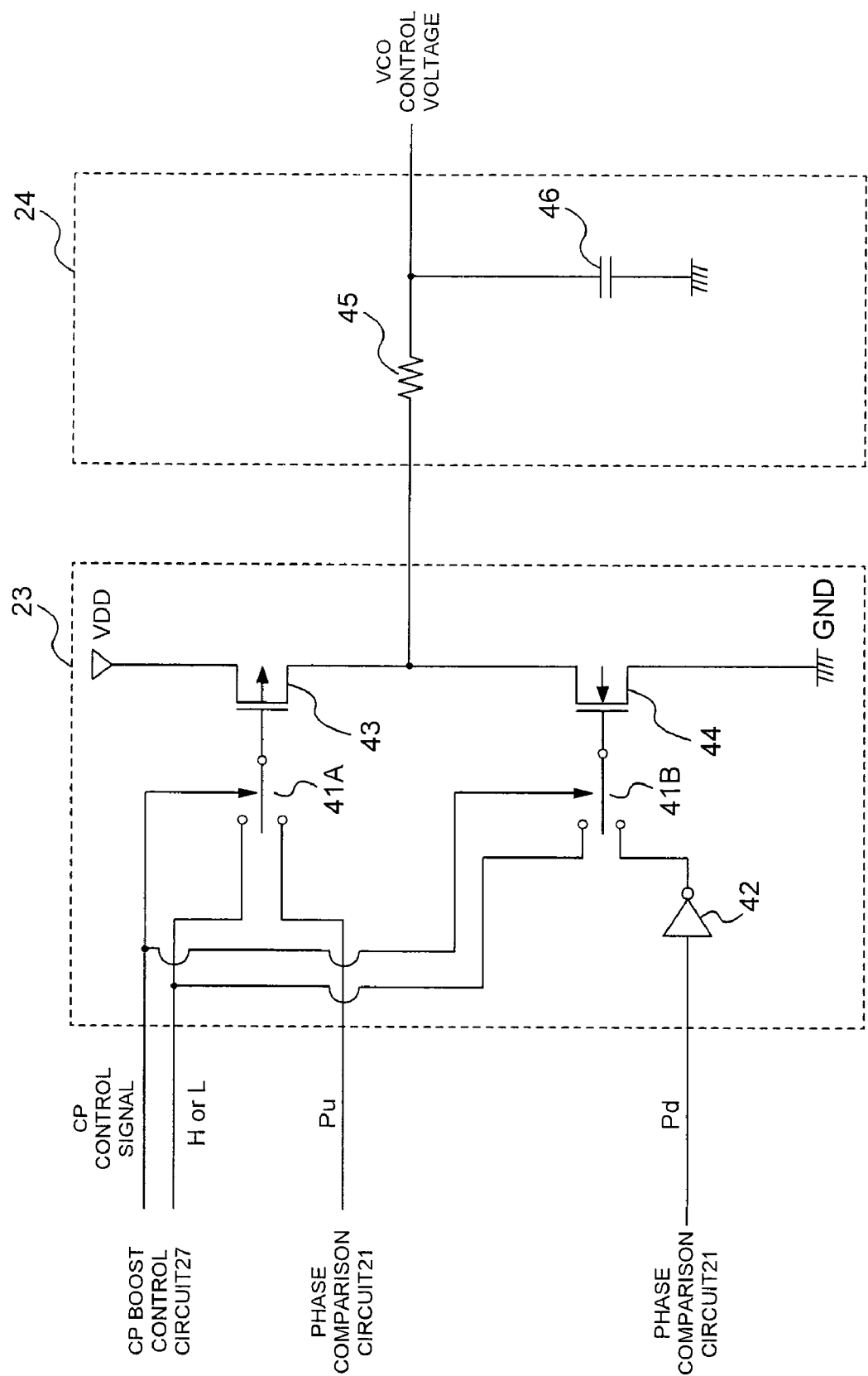
FIG. 5 is a circuit diagram of an example of configurations of a charge pump circuit and an LPF.
Figure 6:
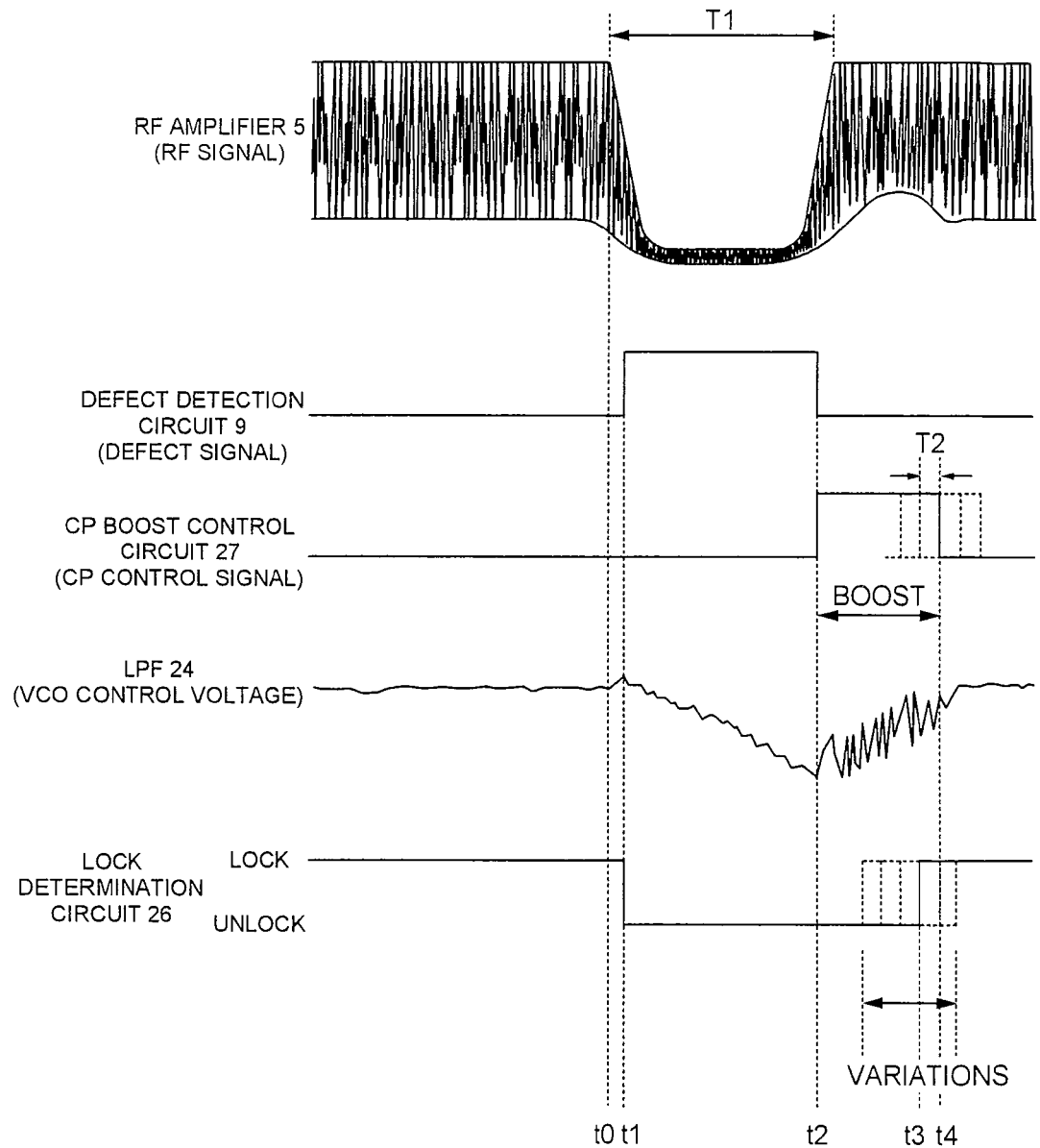
FIG. 6 is a timing chart of an RF signal and the operation of the PLL control circuit according to the present invention.
Figure 7:
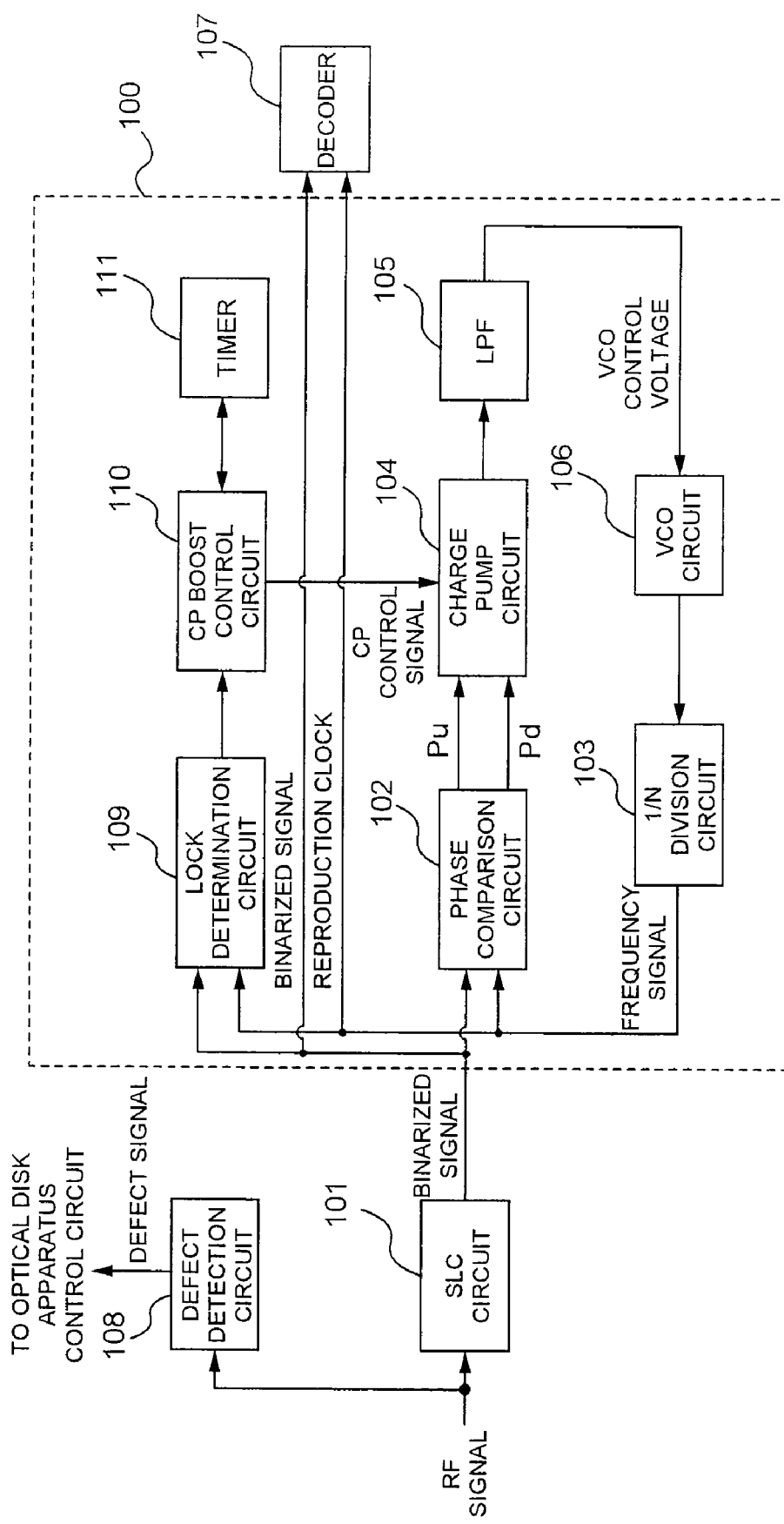
FIG. 7 is a functional block diagram of an example of a conventional PLL control circuit.

Details of the PLL control circuit 11 according to the present invention will be described with reference to FIGS. 3 to 6. FIG. 3 is a functional block diagram of an example of a configuration of the PLL control circuit 11. FIG. 4 depicts an example of configurations of a lock determination circuit 26 (second detection circuit) and a CP boost control circuit 27 (control circuit) shown in FIG. 3. FIG. 5 is a circuit diagram of an example of configurations of a charge pump circuit 23 (control circuit) and an LPF 24. FIG. 6 is a timing chart of an RF signal and the operation of the PLL control circuit 11 according to the present invention.

The PLL control circuit 11 includes a phase comparison circuit 21, a 1/n division circuit 22 (voltage frequency conversion circuit), a charge pump circuit 23, an LPF 24, a VCO circuit 25 (voltage frequency conversion circuit), the lock determination circuit 26, the CP boost control circuit 27, and a timer 28. Although the PLL control circuit 11 and the above defect detection circuit 9 are separately disposed in this embodiment, this is not a limitation and the defect detection circuit 9 may be disposed within the PLL control circuit 11. The phase comparison circuit 21, the 1/n division circuit 22, the charge pump circuit 23, the LPF 24, and the VCO circuit 25 configures a general PLL circuit.

The VCO circuit 25 generates a frequency signal (hereinafter, a frequency signal A) with an oscillating frequency corresponding to the VCO control voltage from the LPF 24 and outputs the signal to the 1/n division circuit 22. A crystal oscillator or an oscillator using a lithium tantalate (LiTaO3) not shown can be applied to the VCO circuit 25.

The 1/n division circuit 22 outputs to the phase comparison circuit 21 and the lock determination circuit 26 a frequency signal (hereinafter, a frequency signal B) acquired by dividing the frequency signal A into 1/n. The signal is divided into 1/n because the general control circuit 15 performs the above process for reproducing information based on the frequency signal A output by the VCO circuit 25 when the phases of the binarized signal and the frequency signal B are synchronized (frequency acquired by multiplying the frequency of the frequency signal B by n).

The phase comparison circuit 21 includes the same configuration as a configuration within a dot-and-dash line of the lock determination circuit 26 shown in FIG. 4. The phase comparison circuit 21 compares the phase of the binarized signal with the phase the frequency signal B, outputs a low-level signal Pu during the time when the phase of the binarized signal is faster than the phase of the frequency signal B, and outputs a high-level signal Pu (phase difference signal) during the time when the phases are synchronized or during the time when the phase of the binarized signal is later than the phase of the frequency signal B. The phase comparison circuit 21 also outputs a low-level signal Pd (phase difference signal) during the time when the phase of the binarized signal is later than the phase of the frequency signal B and outputs a high-level signal Pd when the phases are synchronized or during the time when the phase of the binarized signal is faster than the phase of the frequency signal B.

The lock determination circuit 26 compares the phase of the binarized signal with the phase of the frequency signal B to determine the locking or unlocking of the PLL control circuit 11. Therefore, as shown in FIG. 4, the lock determination circuit 26 includes inverter circuits 32A to 32C and NAND circuits 33A to 33J. The inverter circuit 32A inverts the high level and low level of the binarized signal and outputs the signal to the NAND circuit 33A. The inverter circuit 32B inverts the high level and low level of the frequency signal B and outputs the signal to the NAND circuit 33F. The NAND circuit 33A outputs the low level when both the inverter circuit 32A and the NAND circuit 33H output the high level, and otherwise outputs the high level. The NAND circuit 33B outputs the low level when both the NAND circuit 33A and the NAND circuit 33C output the high level, and otherwise outputs the high level. The NAND circuit 33C outputs the low level when both the NAND circuit 33B and the NAND circuit 33G output the high level, and otherwise outputs the high level. The NAND circuit 33D outputs the low level when both the NAND circuit 33G and the NAND circuit 33E output the high level, and otherwise outputs the high level. The NAND circuit 33E outputs the low level when both the NAND circuit 33D and the NAND circuit 33F output the high level, and otherwise outputs the high level. The NAND circuit 33F outputs the low level when both the inverter circuit 32B and the NAND circuit 33I output the high level, and otherwise outputs the high level. The NAND circuit 33G outputs the low level when the NAND circuit 33A, the NAND circuit 33B, the NAND circuit 33E, and the NAND circuit 33F all output the high level, and otherwise outputs the high level. The NAND circuit 33H outputs the low-level signal Pu when the NAND circuit 33A, the NAND circuit 33B, and the NAND circuit 33G all output the high level, and otherwise outputs the high-level signal Pu. The NAND circuit 33I outputs the low-level signal Pd when the NAND circuit 33E, the NAND circuit 33F, and the NAND circuit 33G all output the high level, and otherwise outputs the high-level signal Pd. Due to these operations, the outputs of the NAND circuits 33H, 33I are not determined for the initial eight inputs of the binarized signal and frequency signal B so as to stabilize the output operation. The NAND circuit 33H subsequently outputs the low-level signal Pu during the time when the phase of the binarized signal is faster than the phase of the frequency signal B and outputs the high-level signal Pu during the time when the phases are synchronized or during the time when the phase of the binarized signal is later than the phase of the frequency signal B. The NAND circuit 33I outputs the low-level signal Pd during the time when the phase of the binarized signal is later than the phase of the frequency signal B and outputs the high-level signal Pd when the phases are synchronized or during the time when the phase of the binarized signal is faster than the phase of the frequency signal B. The NAND circuit 33J outputs the low level when both the NAND circuit 33H and the NAND circuit 33I output the high level, and otherwise outputs the high level. The inverter circuit 32C inverts the low level and high level from the NAND circuit 33J and outputs the level to the CP boost control circuit 27. As a result, when the phases of the binarized signal and the frequency signal B are synchronized, the lock determination circuit 26 outputs the high level indicating that the PLL control circuit 11 is in the locked state. When the phases of the binarized signal and the frequency signal B are not synchronized, the lock determination circuit 26 outputs the low level indicating that the PLL control circuit 11 is in the unlocked state.

The CP boost control circuit 27 is a circuit that performs (boost) control to generate a voltage for synchronizing the phases of the binarized signal and the frequency signal B in the charge pump circuit 23 regardless of the phase comparison between the binarized signal and the frequency signal B by the phase comparison circuit 21, based on the falling edge of the high-level defect signal from the defect detection circuit 9. The CP boost control circuit 27 is a circuit that performs control to stop the boost of the charge pump circuit 23 if the low level from the lock determination circuit 26 is input (the PLL control circuit 11 is relocked) for a predetermined period T2 (see FIG. 6, a predetermined period) while the charge pump circuit 23 is boosted. To perform such a process, the CP boost control circuit 27 includes a switching control circuit 34, a timer control circuit 35, a NOR circuit 36, an AND circuit 37, an EXNOR (Exclusive NOR) circuit 38, a switching circuit 39, and a boosting control circuit 40, as shown in FIG. 4. The switching control circuit 34 switches the switching circuit 39 to one input terminal of the AND circuit 37 to input the defect signal to the AND circuit 37, for example, at the time of the start of the optical disc apparatus 1. Based on the falling edge of the high-level defect signal (the start of the input of the low-level defect signal), the switching control circuit 34 switches the switching circuit 39 to one input terminal of the NOR circuit 36 to input the low-level defect signal to the NOR circuit 36. Based on the control signal from the timer control circuit 35, the switching control circuit 34 switches the switching circuit 39 to one input terminal of the AND circuit 37 to input the defect signal to the AND circuit 37. The AND circuit 37 outputs the high-level CP control signal when both the defect signal and the output of the lock determination circuit 26 are at the high level, and otherwise outputs the low-level CP control signal. The NOR circuit 36 outputs the high level when both the defect signal and the output of the lock determination circuit 26 are at the low level, and otherwise outputs the low level. Based on the high level from the NOR circuit 36, the timer control circuit 35 outputs the high level to the EXNOR circuit 38. Based on the low level from the NOR circuit 36, the timer control circuit 35 outputs the low level to the EXNOR circuit 38 and allows the timer 28 to start clocking. The timer control circuit 35 determines whether the clocking of the timer 28 attains the predetermined period T2 (FIG. 6). The period T2 indicates the period of boosting the charge pump circuit 23 for reliably ensuring the relocking of the PLL control circuit 11. Describing specifically with reference to FIG. 6, in the state immediately after the PLL control circuit 11 is relocked (t3), the VCO control voltage may still be unsteady (between t3 and t4). Consequently, the PLL control circuit 11 may repeatedly be relocked and unlocked and it may take time to make the relocking steady. Therefore, in the period T2, the charge pump circuit 23 can be boosted to relock the PLL control circuit 11 more quickly and reliably. If it is determined that the clocking of the timer 28 attains the predetermined period T2, the timer control circuit 35 outputs the high level to the EXNOR circuit 38 and transmits the control signal to the switching control circuit 34 to switch the switching circuit 39 to one input terminal of the AND circuit 37. The EXNOR circuit 38 outputs the high-level CP control signal when the outputs of the NOR circuit 36 and the timer control circuit 35 are identical, and outputs the low-level CP control signal when the outputs are not identical. Based on the high level from the EXNOR circuit 38, the boosting control circuit 40 outputs the low level of a predetermined period periodically to boost the charge pump circuit 23 and synchronize the phases of the binarized signal and the frequency signal B. Based on the low level from the EXNOR circuit 38, the boosting control circuit 40 stops the output of the low level.

The charge pump circuit 23 is a circuit that generates a voltage (control voltage) for synchronizing the phases of the binarized signal and the frequency signal B based on the levels of the signals Pu and Pd from the phase comparison circuit 21. The charge pump circuit 23 is a circuit that generates (boosts) a voltage (control voltage) for synchronizing the phases of the binarized signal and the frequency signal B regardless of the phase comparison between the binarized signal and the frequency signal B by the phase comparison circuit 21, based on the high-level CP control signal and the low level from the boosting control circuit 40. To perform such a process, the charge pump circuit 23 includes an inverter circuit 42, switching circuits 41A (input signal control circuit), 41B (input signal control circuit), a P-MOSFET (Metal Oxide Semiconductor Field Effect Transistor) 43, and an N-MOSFET 44, as shown in FIG. 5. The switching circuit 41A is switched to the side of the phase comparison circuit 21 in response to the low-level CP control signal and is switched to the side of the CP boost control circuit 27 in response to the high-level CP control signal. By switching the switching circuit 41A to the side of the phase comparison circuit 21, the signal Pu is input to the P-MOSFET 43, which is turned on when the signal Pu is at the low level and turned off when the signal Pu is at the high level. By turning on the P-MOSFET 43, a power supply voltage VDD is output to the LPF 24. That is, when the switching circuit 41A is switched to the side of the phase comparison circuit 21, the charge pump circuit 23 outputs the voltage to the voltage to the LPF 24 based on the phase comparison between the binarized signal and the frequency signal B by the phase comparison circuit 21. By switching the switching circuit 41A to the side of the CP boost control circuit 27, the P-MOSFET 43 is turned on by the low level from the boosting control circuit 40. By turning on the P-MOSFET 43, the power supply voltage VDD is output to the LPF 24 (the charge pump circuit 23 is boosted). That is, when the switching circuit 41A is switched to the side of the CP boost control circuit 27, the charge pump circuit 23 outputs the voltage to the LPF 24 regardless of the phase comparison between the binarized signal and the frequency signal B by the phase comparison circuit 21. The inverter circuit 42 inverts the high level and low level of the signal Pd and outputs the signal to the switching circuit 41B. The switching circuit 41B is switched to the side of the phase comparison circuit 21 in response to the low-level CP control signal and is switched to the side of the CP boost control circuit 27 in response to the high-level CP control signal. By switching the switching circuit 41B to the side of the phase comparison circuit 21, the signal Pd is input to the N-MOSFET 44, which is turned on when the signal Pd is at the low level and turned off when the signal Pd is at the high level. By turning on the N-MOSFET 44, a GND-level voltage is output to the LPF 24. That is, when the switching circuit 41B is switched to the side of the phase comparison circuit 21, the charge pump circuit 23 outputs the voltage to the LPF 24 based on the phase comparison between the binarized signal and the frequency signal B by the phase comparison circuit 21. By switching the switching circuit 41B to the side of the CP boost control circuit 27, the N-MOSFET 44 is turned off by the low level from the boosting control circuit 40. That is, when the switching circuit 41B is switched to the side of the CP boost control circuit 27, the charge pump circuit 23 outputs the 23 outputs the voltage based on the turning on of the P-MOSFET 43 to the LPF 24 regardless of the phase comparison between the binarized signal and the frequency signal B by the phase comparison circuit 21.

The LPF 24 includes a resistor 45 and a capacitor 46 and is an RC integration circuit that removes the alternating current component of the output voltage of the charge pump circuit 23 with the capacitor 46 for smoothing. The capacitor 46 is charged by injecting the charge with the output voltage (power supply voltage VDD) of the charge pump circuit 23. As a result, the VCO control voltage is increased which is output from the LPF 24 to the VCO circuit 25. The capacitor 46 is discharged by pulling out the charge with the output voltage (GND level) of the charge pump circuit 23. As a result, the VCO voltage is decreased which is output from the LPF 24 to the VCO circuit 25.

==Operation of PLL Control Circuit 11==

The operation of the PLL control circuit 11 according to the present invention will be described with reference to FIG. 6 and to FIGS. 1 to 4 as needed. The operation until t10 for applying the laser beam to the defect of the optical disc 80 will not be described since the PLL control circuit 11 performs the typical operation for synchronizing the phases of the binarized signal and the frequency signal B.

The RF amplifier 5 amplifies the photoelectric conversion signal from the optical pickup 4 when the laser beam is applied to the defect of the optical disc 80 with a predetermined gain to generate the RF signal, which is output to the defect detection circuit 9 and the SLC circuit 10 (during T1 after t0). The SLC circuit 10 outputs to the PLL control circuit 11 the binarized signal acquired by performing binarization at the slice level determined by the feedback control for the RF signal. With regard to this binarized signal, since the slice level becomes unsteady because the binarization process is performed for the RF signal having unsteady amplitude shown in the period T1 of FIG. 6, the binarized signal also is an unsteady signal.

The bottom hold circuit 16 of the defect detection circuit 9 holds the peak level of a predetermined period of the RF signal. The peak hold circuit 17 holds the bottom level of the same predetermined period of the RF signal. The subtracting circuit 18 outputs to the comparison circuit 20 the electric signal indicating the subtraction result acquired by subtracting the bottom level held by the bottom hold circuit 17 from the peak level held by the peak hold circuit 16. The reference electric signal generation circuit 19 outputs the reference electric signal to the comparison circuit 20. When the laser beam is applied to the defect of the optical disc 80, the amplitude of the RF signal is smaller than the amplitude of the RF signal acquired when the laser beam is not applied to the defect of the optical disc 80 and, therefore, the comparison circuit 20 outputs to the PLL control circuit 11 the high-level defect signal indicating that the level of the electric signal is less than the level of the reference electric signal (t1).

The VCO circuit 25 generates the frequency signal A with an oscillating frequency corresponding to the VCO control voltage from the LPF 24 and outputs the signal to the 1/n division circuit 22. The 1/n division circuit 22 outputs to the phase comparison circuit 21 and circuit 21 and the lock determination circuit 26 the frequency signal B acquired by dividing the frequency signal A into 1/n.

The phase comparison circuit 21 and the lock determination circuit 26 compare the phase of the binarized signal with the phase the frequency signal B when the laser beam is applied to the defect of the optical disc 80. Since this binarized signal is an unsteady signal as above, the phases of the binarized signal and the frequency signal B are asynchronous, and the phase comparison circuit 21 outputs to the charge pump circuit 23 the low-level signal Pu or signal Pd corresponding to whether the phase of the binarized signal is faster or later than the phase of the frequency signal B. Similarly, the lock determination circuit 26 outputs to the CP boost control circuit 27 the low level indicating that the PLL control circuit 11 is unlocked (t1). The switching control circuit 34 of the CP boost control circuit 27 switches the switching circuit 39 to one input terminal of the AND circuit 37, for example, at the time of the start of the optical disc apparatus 1. As a result, the high-level defect signal and the low level from the lock determination circuit 26 are input to the AND circuit 37. The AND circuit 37 outputs the low-level CP control signal to the charge pump circuit 23. The switching circuits 41A and 41B are switched to the side of the phase comparison circuit 21 in response to the low-level CP control signal. As a result, the charge pump circuit 23 outputs the voltage (power supply voltage VDD or GND) based on the phase comparison between the binarized signal and the frequency signal B by the phase comparison circuit 21 when the laser beam is applied to the defect of the optical disc 80, and the LPF 24 outputs the VCO control voltage (between t0 and t1) corresponding to the voltage.

When the optical disc 80 is rotated and the laser beam is no longer applied to the defect of the optical disc 80, the amplitude of the RF signal is gradually increased and, therefore, the comparison circuit 20 of the defect detection circuit 9 outputs to the PLL control circuit 11 the low-level defect signal indicating that the level of the electric signal is equal to or greater than the level of the reference electric signal (t2). Based on the falling edge of the high-level defect signal (the start of the input of the low-level defect signal), the switching control circuit 34 of the CP boost control circuit 27 switches the switching circuit 39 to one input terminal of the NOR circuit 36 to input the low-level defect signal to the NOR circuit 36. The NOR circuit 36 outputs the high level since both the defect signal and the output of the lock determination circuit 26 are at the low level. Based on the high level of the NOR circuit 36, the timer control circuit 35 outputs the high level to the EXNOR circuit 38. Since the outputs of the NOR circuit 36 and the timer control circuit 35 are identical, the EXNOR circuit 38 outputs the high-level CP control signal (t2). Based on the high level from the EXNOR circuit 38, the boosting control circuit 40 repeatedly outputs the low level of a predetermined period to boost the charge pump circuit 23 and synchronize the phases of the binarized signal and the frequency signal B. The switching circuits 41A and 41B of the charge pump circuit 23 are switched to the side of the CP boost control circuit 27 in response to the high-level CP control signal. As a result, the P-MOSFET 43 is turned on by the low level from the boosting control circuit 40, and the power supply voltage VDD is output to the LPF 24 (the charge pump circuit 23 is boosted). That is, the charge pump circuit 23 outputs the voltage to the LPF 24 regardless of the phase comparison between the binarized signal and the frequency signal B by the phase comparison circuit 21. The capacitor 46 of the LPF 24 is charged by injecting the charge with the output voltage (power supply voltage VDD) of the charge pump circuit 23. As a result, the VCO control voltage is increased which is output from the LPF 24 to the VCO circuit 25. The VCO circuit 25 generates the frequency signal A with an oscillating frequency corresponding to the VCO control voltage from the LPF 24 and outputs the signal to the 1/n division circuit 22. The 1/n division circuit 22 outputs to the phase comparison circuit 21 and the lock determination circuit 26 the frequency signal B acquired by dividing the frequency signal A into 1/n. Due to the boost of the charge pump circuit 23 based on the falling edge of the high-level defect signal, the phases of the binarized signal and the frequency signal B are synchronized (the PLL control circuit 11 is relocked) after the laser beam is applied to the defect of the optical disc 80.

The phase comparison circuit 21 and the lock determination circuit 26 receive the input of the binarized signal and the frequency signal B having the phases synchronized. Due to the synchronization of the phases of the binarized signal and the frequency signal B, the phase comparison circuit 21 outputs the high-level signal PU and signal Pd to the charge pump circuit 23. Due to the synchronization of the phases of the binarized signal and the frequency signal B, the lock determination circuit 26 outputs the high level to the CP boost control circuit 27 (t3). The NOR circuit 36 of the CP boost control circuit 27 outputs the low level based on the low-level defect signal and the high level from the lock determination circuit 26. Based on the low level from the NOR circuit 36, the timer control circuit 35 outputs the low level to the EXNOR circuit 38 and allows the timer 28 to start clocking. The timer control circuit 35 determines whether the clocking of the timer 28 attains the predetermined period T2. Since the outputs of the NOR circuit 36 and the timer control circuit 35 are identical, the EXNOR circuit 38 outputs the high-level CP control signal. Therefore, the switching circuits 41A and 41B of the charge pump circuit 23 is retained in the state after the switching to the side of the CP boost control circuit 27 in response to the high-level CP control signal. Based on the high level from the EXNOR circuit 38, the boosting control circuit 40 continues the repetitive output of the low level of a predetermined period. That is, the boosted state of the charge pump circuit 23 is retained.

If it is determined that the clocking of the timer 28 attains the predetermined period T2, the timer control circuit 35 outputs the high level to the EXNOR circuit 38 and transmits the control signal to the switching control circuit 34 to switch the switching circuit 39 to one input terminal of the AND circuit 37.

The EXNOR circuit 38 outputs the low-level CP control signal based on the high level from the timer control circuit 35 and the low level of the NOR circuit 36 (t4). As a result, the boosting control circuit 40 stops the output of the low level and the boost of the charge pump circuit 23 is stopped. The switching circuits 41A and 41B are switched to the side of the phase comparison circuit 21 in response to the low-level CP control signal. Therefore, the signal Pu is input to the P-MOSFET 43 again based on the phase comparison between the binarized signal and the frequency signal B by the phase comparison circuit 21. The signal Pd is input to the N-MOSFET 44 again via the inverter circuit 42. That is, the PLL control circuit 11 performs the typical operation based on the phase comparison between the binarized signal and the frequency signal B by the phase comparison circuit 21. The reproduction clock is the frequency signal B synchronized with the binarized signal and is input to the decoder 12 along with the binarized signal for the reproduction process of the optical disc apparatus 1.

Although the configuration of the defect detection circuit 9 includes both the peak hold circuit 16 and the bottom hold circuit 17 according to the above embodiment, this is not a limitation. For example, the same effect can be achieved by including only the peak hold circuit 16 and by setting the peak level of the RF signal when the laser beam is not applied to the defect as the reference electric signal, which is output to the comparison circuit 20. Only the bottom hold circuit 17 may be included in the configuration. By including only one of the circuits in the configuration of the defect detection circuit 9, the cost of the other hold circuit and the subtracting circuit 18 can be reduced, and the circuit wiring, etc., can be prevented from being complicated.

According to the above embodiment, the voltage can be generated (boosted) in the charge pump circuit 23 for synchronizing the phases of the phases of the binarized signal and the frequency signal B based on the falling edge of the high-level defect signal. The boost of the charge pump circuit 23 can be terminated based on the synchronization of the phases of the binarized signal and the frequency signal B. As a result, the charge pump circuit 23 can be boosted regardless of whether the RF signal affected by the defect signal is long or short, and the boost period of the charge pump circuit 23 can be made approximately constant. Therefore, the power consumption relating to the boost of the charge pump circuit 23 can be reduced, and the phase synchronization of the binarized signal and the frequency signal can be prevented from being delayed. The performance can be improved in the information reproduction process in the optical disc apparatus 1.

When the predetermined period T2 has elapsed after the phases of the binarized signal and the frequency signal B are synchronized, the boost of the charge pump circuit 23 can be terminated. As a result, the phases of the binarized signal and the frequency signal B can be synchronized (the PLL control circuit 11 can be relocked) more quickly and reliably.

The switching circuits 41A and 41B can be switched to the side of the CP boost control circuit 27 based on the falling edge of the high-level defect signal, and the switching circuits 41A and 41B can be switched to the side of the phase comparison circuit 21 after the predetermined period T2 has elapsed. As a result, the input of the signal Pu and signal Pd from the phase comparison circuit 21 can be prohibited during the period of boosting of the charge pump circuit 23, and the malfunctions of the charge pump circuit 23 can be prevented. The input of the signal Pu and signal Pd from the phase comparison circuit 21 can be permitted after ensuring the synchronization of the phases of the binarized signal and the frequency signal B, and the PLL control circuit 11 can operate based on the phase comparison result of the phase comparison circuit 21.

The comparison circuit 20 can determine whether or not the electric signal having at least one level of the peak and bottom levels of the RF signal is equal to or greater than the reference electric signal. As a result, by outputting the high-level defect signal with the comparison circuit 20, it can be certainly determined that the laser beam is applied to the defect of the optical disc 80, and by outputting the low-level defect signal with the comparison circuit 20, it can be certainly determined that the laser beam is not applied to the defect of the optical disc 80.

Although hardware is used to indicate the start of the boost of the charge pump circuit 23 based on the falling edge of the high-level defect signal and the end of the boost of the charge pump circuit 23 based on the synchronization of the phases of the binarized signal and the frequency signal B in the above description, this is not a limitation. The processes based on the above signals (the defect signal, the output signal of the lock determination circuit 26, the clocking signal of the timer 28) can be stored in advance as program data in the ROM 30, etc., and the software processes can be performed by reading the program data. As a result, for example, the constituent elements of the CP boost control circuit 27 can be omitted except the above boosting control circuit 40 to reduce the cost of the PLL control circuit 11 and to simplify the circuit wiring.

Although description has been made of the PLL control circuit of the optical disc apparatus and the recording medium recording the program for controlling the optical disc apparatus of the present invention, the above description is for the purpose of facilitating the understanding of the present invention and does not limit the interpretation of the present invention. The present invention may be changed/altered without departing from the spirit thereof and includes the equivalents thereof.

The invention claimed is:

1. A PLL control circuit of an optical disc apparatus comprising:
   a voltage frequency conversion circuit that adjusts an oscillating frequency based on a control voltage to generate a first frequency signal;
   a phase comparison circuit that compares the phase of the first frequency signal with the phase of a second frequency signal generated based on an RF (Radio Frequency) signal at the time of photoelectric conversion of reflected light of the laser beam applied to an optical disc, to generate a phase difference signal indicating a phase difference between the first frequency signal and the second frequency signal;
   a charge pump circuit that generates the control voltage for synchronizing the phases of the first frequency signal and the second frequency signal according to the phase difference signal;
   a first detection circuit that detects whether the RF signal exceeds a predetermined level;
   a second detection circuit that detects whether the phases of the first frequency signal and the second frequency signal are synchronized; and
   a control circuit that controls the charge pump circuit;
   to generate the control voltage regardless of the phase difference signal, if the first detection circuit detects that the RF signal exceeds the predetermined level, and
   to generate the control voltage according to the phase difference signal, if the second detection circuit detects that the phases of the first frequency signal and the second frequency signal are synchronized.

2. The PLL control circuit of an optical disc apparatus of claim 1, wherein
   the control circuit controls the charge pump circuit to generate the control voltage according to the phase difference signal, when a predetermined period has elapsed after the second detection circuit detects that the phases of the first frequency signal and the second frequency signal are synchronized.

3. The PLL control circuit of an optical disc apparatus of claim 2, wherein
   the control circuit further comprises an input signal control circuit that:
   prohibits the input of the phase difference signal to the charge pump circuit based on a detection result of the first detection circuit indicating that the RF signal exceeds the predetermined level; and
   permits the input of the phase difference signal to the charge pump circuit, when the predetermined period has elapsed.

4. The PLL control circuit of an optical disc apparatus of claim 1, wherein
   the first detection circuit further comprises:
   a holding circuit that holds at least one level of the peak level and the bottom level of the RF signal; and
   a level detection circuit that detects whether the RF signal exceeds the predetermined level, according to a comparison result between the level held by the holding circuit and a reference level.

5. A non-transitory recording medium having a program recorded thereon, the program operable to
   drive a computer controlling an optical disc apparatus that comprises:
   a PLL circuit including
   a voltage frequency conversion circuit that adjusts an oscillating frequency based on a control voltage to generate a first frequency signal,
   a phase comparison circuit that compares the phase of the first frequency signal with the phase of a second frequency signal generated based on an RF signal at the time of photoelectric conversion of reflected light of the laser beam applied to an optical disc, to generate a phase difference signal indicating a phase difference between the first frequency signal and the second frequency signal, and
   a charge pump circuit that generates the control voltage for synchronizing the phases of the first frequency signal and the second frequency signal according to the phase difference signal;
   a first detection circuit that detects whether the RF signal exceeds a predetermined level; and
   a second detection circuit that detects whether the phases of the first frequency signal and the second frequency signal are synchronized;
   to implement a function of controlling the charge pump circuit to generate the control voltage regardless of the phase difference signal, if the first detection circuit detects that the RF signal exceeds the predetermined level, and to generate the control voltage according to the phase difference signal, if the second detection circuit detects that the phases of the first frequency signal and the second frequency signal are synchronized.

* * * * *